United States Patent
Sieg

(10) Patent No.: US 10,837,850 B2
(45) Date of Patent: Nov. 17, 2020

(54) ARRANGEMENT FOR AN EVALUATION IN A CAPACITIVE SENSOR DEVICE OF A VEHICLE

(71) Applicant: Huf Hülsbeck & Fürst GmbH & Co. KG, Velbert (DE)

(72) Inventor: Berthold Sieg, Bottrop (DE)

(73) Assignee: Huf Hülsbeck & Fürst GmbH & Co. KG, Velbert (DE)

( * ) Notice: Subject to any disclaimer, the term of this patent is extended or adjusted under 35 U.S.C. 154(b) by 75 days.

(21) Appl. No.: 16/129,819

(22) Filed: Sep. 13, 2018

(65) Prior Publication Data
US 2019/0078954 A1    Mar. 14, 2019

(30) Foreign Application Priority Data

Sep. 14, 2017  (DE) .................. 10 2017 121 377
Jun. 4, 2018   (DE) .................. 10 2018 113 253

(51) Int. Cl.
G01R 27/26  (2006.01)
G01L 9/12   (2006.01)
(Continued)

(52) U.S. Cl.
CPC .............. G01L 9/12 (2013.01); E05F 15/73 (2015.01); G01D 5/24 (2013.01); G01R 27/2605 (2013.01);
(Continued)

(58) Field of Classification Search
CPC ........ G01R 27/2605; G01L 9/12; G01D 5/24; H03K 17/955; H03K 17/962–9622
(Continued)

(56) References Cited

U.S. PATENT DOCUMENTS 5,730,165 A * 3/1998 Philipp .................. E03C 1/057
                                                 137/1
6,946,853 B2 * 9/2005 Gifford ................ H03K 17/955
                                                 324/658
(Continued)

FOREIGN PATENT DOCUMENTS

DE      29721213        1/1998
DE      102012224037    6/2014
(Continued)

OTHER PUBLICATIONS

Europäischer Recherchenbericht und die Stellungnahme zur Europäischen Recherche [European Search Report and the European Search Opinion] Dated Jan. 24, 2019 From the European Patent Office Re. Application No. 18193120.5 and Its Summary of the European Search Opinion in English. (8 Pages).
(Continued)

Primary Examiner — Patrick Assouad
Assistant Examiner — Demetrius R Pretlow

(57) ABSTRACT

The invention relates to an arrangement (10) for an evaluation in a capacitive sensor device (20) of a vehicle (1), in particular for the detection of an activation action at the vehicle (1), comprising:
- at least one sensor element (20.1) for the detection of a change in a surroundings of the sensor element (20.1),
- an electric holding arrangement (50.4) which is connected to the sensor element (20.1) for the transfer of charge,
- a control device (50) for the repeated determination (100) of at least one parameter of the sensor element (20.1) specific to the detection, in order to perform the evaluation,
- at least one controlling means (50.6) of the control device (50) in order to perform for the respective determination (100) of the parameter the transfer of charge repeatedly as pulses (P) with a predetermined number
(Continued)

(N), so that a state of charge of the holding arrangement (50.4) is changed successively.

17 Claims, 5 Drawing Sheets

(51) Int. Cl.
*G01D 5/24* (2006.01)
*H03K 17/955* (2006.01)
*E05F 15/73* (2015.01)
*H03K 17/96* (2006.01)

(52) U.S. Cl.
CPC ......... *H03K 17/955* (2013.01); *H03K 17/962* (2013.01); *E05Y 2400/852* (2013.01); *E05Y 2400/858* (2013.01); *E05Y 2900/531* (2013.01); *E05Y 2900/546* (2013.01); *E05Y 2900/548* (2013.01); *H03K 2017/9602* (2013.01); *H03K 2217/94052* (2013.01); *H03K 2217/960705* (2013.01); *H03K 2217/960725* (2013.01)

(58) Field of Classification Search
USPC .................................................. 324/658–690
See application file for complete search history.

(56) References Cited

U.S. PATENT DOCUMENTS

| | | | | |
|---|---|---|---|---|
| 8,169,238 | B1* | 5/2012 | Maharyta | G01D 5/24 324/658 |
| 8,330,609 | B2* | 12/2012 | Miyamori | B60N 2/002 280/801.1 |
| 8,350,826 | B2* | 1/2013 | Watanabe | G06F 3/0418 324/658 |
| 8,363,031 | B2* | 1/2013 | Geaghan | G06F 3/044 178/18.06 |
| 8,614,587 | B1* | 12/2013 | Ogirko | G06F 3/044 324/678 |
| 8,860,686 | B2* | 10/2014 | Simmons | G06F 3/0416 178/18.03 |
| 2004/0004488 | A1* | 1/2004 | Baxter | G01D 5/24 324/678 |
| 2005/0099188 | A1* | 5/2005 | Baxter | G01D 5/24 324/678 |
| 2006/0061372 | A1* | 3/2006 | Hayakawa | G01P 15/125 324/679 |
| 2006/0192568 | A1* | 8/2006 | Pasero | G01D 5/2405 324/667 |
| 2007/0176609 | A1* | 8/2007 | Ely | G06F 3/044 324/678 |
| 2007/0194800 | A1* | 8/2007 | Novikov | G01R 27/2605 324/676 |
| 2008/0042660 | A1* | 2/2008 | Ely | G01R 27/2605 324/678 |
| 2009/0224775 | A1* | 9/2009 | Nishizono | H03K 17/962 324/658 |
| 2012/0182028 | A1* | 7/2012 | Oya | G06F 3/0416 324/684 |
| 2013/0304397 | A1* | 11/2013 | Erlandsson | G01N 27/22 702/30 |
| 2014/0035601 | A1* | 2/2014 | Fujiyoshi | G01R 35/00 324/684 |
| 2014/0104226 | A1* | 4/2014 | Lee | G06F 3/044 345/174 |
| 2014/0210491 | A1* | 7/2014 | Jonsson | G01R 27/2605 324/661 |
| 2015/0316680 | A1* | 11/2015 | Sieg | G01B 7/14 324/686 |
| 2016/0025520 | A1* | 1/2016 | Pribisic | E05F 15/46 324/686 |
| 2016/0098877 | A1* | 4/2016 | Tokudome | G07C 9/00944 340/5.72 |
| 2017/0307668 | A1* | 10/2017 | Buffa | G01R 27/2605 |

FOREIGN PATENT DOCUMENTS

| | | | | |
|---|---|---|---|---|
| JP | | 2006524807 A | * 10/2010 | ............... E05B 1/78 |
| WO | WO 2016/061429 | | 4/2016 | |

OTHER PUBLICATIONS

Internationaler Recherchenbericht und Schriftlicher Bescheid [International Search Report and the Written Opinion] dated Dec. 12, 2018 From the International Searching Authority Re. Application No. PCT/EP2018/074124. (13 Pages).

Internationaler Recherchenbericht und Schriftlicher Bescheid [International Search Report and the Written Opinion] dated Nov. 20, 2018 From the International Searching Authority Re. Application No. PCT/EP2018/074102. (13 Pages).

Internationaler Recherchenbericht und Schriftlicher Bescheid [International Search Report and the Written Opinion] dated Nov. 20, 2018 From the International Searching Authority Re. Application No. PCT/EP2018/074112. (13 Pages).

* cited by examiner

ARRANGEMENT FOR AN EVALUATION IN A CAPACITIVE SENSOR DEVICE OF A VEHICLE

RELATED APPLICATIONS

This application claims the benefit of priority of German Patent Applications Nos. 10 2017 121 377.5 filed Sep. 14, 2017, and 10 2018 113 253.0 filed Jun. 4, 2018, the contents of which are incorporated herein by reference in their entirety.

FIELD AND BACKGROUND OF THE INVENTION

The present invention relates to an arrangement for an evaluation in a capacitive sensor device of a vehicle. Furthermore, the invention relates to a method for an evaluation in a capacitive sensor device.

It is known from the prior art that a variable capacitance can be formed by means of a sensor element, such as a sensor electrode, which capacitance is specific to changes in the environment of the sensor electrode. In other words, it can be detected by a detection of a change of this capacitance if an approach or a gesture or the like occurs in the region of the sensor electrode. This detection is used to activate functions of the vehicle. These functions include the opening of a tailgate and the unlocking of vehicle doors, for example.

Since electric charges are shifted for determination or detection of the capacitance, e.g. by means of a charge-reversal method, for one, the energy consumption of such a sensor is problematic, and on the other hand, the interference of electromagnetic fields as immission (interference impact on the sensor) and/or emission (interference effect of the sensor on the environment) is a problem. Such interferences can be external interference fields, for example, as caused by inductive charging of the vehicle. An improvement of the sensor with respect to these disadvantages can be technically elaborate and/or expensive.

SUMMARY OF THE INVENTION

It is thus an object of the present invention to at least partially remove the above described disadvantages. In particular, it is an object of the present invention to improve the energy consumption of the evaluation in a capacitive sensor device of a vehicle and/or to improve the properties in terms of interfering signals.

The above object is achieved by means of an arrangement having the features of the independent device claim and by a method having the features of the independent method claim. Further features and details of the invention result from the respective dependent claims, the description and the drawings. Features and details described in conjunction with the arrangement according to the invention also apply in conjunction with the method according to the invention and vice versa, so that mutual reference is made or can be made to the individual aspects of the invention in any case with respect to the disclosure.

In particular, the object is achieved by means of an arrangement, preferably a circuit arrangement, for an evaluation of a capacitive sensor device of a vehicle, in particular for the detection of an activation action at the vehicle.

It is advantageous here if the vehicle is formed as a motor vehicle, in particular a hybrid vehicle or an electric vehicle, preferably with a high-voltage on-board power supply system and/or an electric motor. Furthermore, it can be possible that the vehicle is formed as a fuel cell vehicle or and/or as a passenger car and/or as a semi-autonomous or autonomous vehicle. The vehicle advantageously comprises a security system, which allows authentication e.g. by a communication with an identification transmitter (ID transponder). Depending on the communication and/or authentication, at least one function of the vehicle can be activated. If the authentication of the ID transponder is required to that end, this function can be a security-relevant function, such as an unlocking of the vehicle or an unblocking of an engine start. Thus, the security system can also be configured as a passive access system, which initiates the authentication and/or activation of the function in a detection of the approaching of the ID transmitter to the vehicle without active manual actuation. To that end, for example, a wake-up signal is repeatedly emitted by the security system, which can be received by the ID transponder upon the approach, and then triggers the authentication. The function can also relate to an activation of a vehicle lighting system and/or an actuation (opening and/or closing) of a flap (e.g. front or rear or side flap or door). For example, upon the detection of the activation action such an approach or a gesture of a user, the function is activated, e.g. a vehicle lighting system is activated and/or the flap is actuated and/or the unlocking is performed.

For example, the capacitive sensor device is integrated in a door handle of the vehicle. In this case, the detection of the activation action, such as an approach to the door handle, can cause the unlocking or the opening of a door, for example. Likewise, the capacitive sensor device can be integrated in a bumper or the like. Then, the detection of the activation action, e.g. a moving of a foot under the bumper, can trigger the opening of the flap, for example.

The arrangement according to the invention (in particular for the provision of a detection) may comprise (the following components can preferably be electronic elements which are arranged on at least one circuit board and/or electrically connected to one another, for example):

- at least one (in particular electrically-conducting) sensor element for the detection of a change in an environment of the sensor element, preferably in a vehicle environment outside the vehicle,
- an electric holding arrangement, which is interconnected, in particular connected to the sensor element (in particular electrically and/or via at least one electric circuit element and/or via at least one controlling means) for the transfer of charge, and which preferably comprises at least one (holding) capacitor, in order to provide a hold capacitance,
- a control device, preferably a control circuit arrangement, for the repeated determination of at least one parameter (such as a variable vehicle capacitance) of the sensor element specific to the detection (of the sensor element) in order to perform the evaluation, wherein the control device is e.g. formed as at least one microcontroller and/or integrated circuit and/or electronics (i.e. also as a system of multiple electronic components) and/or the like, and wherein preferably the holding arrangement can be part of the control device or is formed separately (externally) thereof,
- at least one controlling means of the control device, in order to perform the charge transfer repeatedly as pulses for the respective determination of the parameter, preferably with a predetermined (known) number, so that successively a state of charge of the holding arrangement is changed (in particular for a respective individual determination).

In other words, repeated transfers of charge can be used for a (single) determination, which successively change the state of charge in the scope of this (single) determination, preferably either increase or lower it. To that end, during and/or between the charge transfers, a hold of the charge already stored in the holding device can be necessary to enable the successive changing (increasing or lowering) of the state of charge. By the charge transfers, new charge can be added to the holding arrangement from the sensor element accordingly.

Advantageously, the number or pulses is predetermined, i.e. the number of the charge transfers for the respective determination is determined and/or known in advance before performing a respective determination, and therefore does not change by the change of the sensor capacitance. Correspondingly, a discrimination of the used measuring principle against conventional evaluations of a sensor capacitance can be provided, since not the number of pulses is the (unknown) measuring value to be detected, but instead e.g. the state of charge after performing the repeated charge transfers with the predetermined number. For example, after having performed the repeated charge transfer by the predetermined number of times, the state of charge is measured (in particular a voltage resulting therefrom). The level of the measured state of charge and/or the measured voltage on the holding arrangement resulting therefrom is e.g. proportional to the sensor capacitance or to the parameter. A change of the environment can then, e.g., be concluded from a change of the measured state of charge for different determinations. The measuring principle according to the invention can reduce the susceptibility to interference and/or the emitting of interferences significantly. Moreover, a flexible adjustment of the evaluation frequency and/or of the energy consumption can be effected by defining the number of repeated charge transfers.

In particular, the charge transfer is performed repeatedly for the respective determination of the parameter, i.e. multiple charge transfers or multiple pulses are initiated for a single determination. In this context, it is also possible to speak of a determination by means of multiple pulses which is e.g. enabled in that, first, the sensor element is (re)charged and/or pulled to a fixed potential prior to each of the pulses. Subsequently, the charge of the sensor element is at least partially or largely transferred to the holding arrangement by the charge transfer. After that, the charge can remain stored (held) on the holding arrangement, e.g. in that the holding arrangement is switched floating, while the sensor element is charged for the next charge transfer again. This process can be repeated by the number of N times, i.e. the charge stored in the holding arrangement can be accumulated, until the end-of-charge voltage is measured on the holding arrangement for the evaluation, for example. Subsequently, as the case may be, the next determination can be performed. For the repeated performing of the charge transfer, the reliability in detection can be increased for an individual determination. By the repeated performing of the determination (and thus also of the detection), the surroundings can be continuously monitored, in turn, for the presence of the activation action.

The repeated determination of the at least one parameter of the sensor element specific to the detection can e.g. include a time-repeated determination of a current value of a variable sensor capacitance or the change thereof. In this way, a monitoring of the sensor capacitance can take place reliably in such a way that a change of the sensor capacitance is detected which is specific to an activation action or the like. The determination of the parameter and/or the detection of the change can occur through the measuring of a voltage, for example, which is specific to the parameter, e.g. by the detection of a voltage difference, which is specific to the change of the sensor capacitance in an activation action. The capturing and/or detection is preferably performed by a processing device.

It can be possible that first the sensor electrode is charged for each or some (e.g. every second) of the repeatedly performed charge transfers and/or connected to a fixed potential, in order to (in particular subsequently) perform one of the charge transfers. In other words, each of the charge transfers can lead to a (at least predominant) discharge of the sensor element, so that are charging of the sensor element is required subsequently to be able to perform the charge transfer again. Thus, as the case may be, it is necessary for the repeated performing of charge transfers that the hold capacitance is greater than the sensor capacitance.

Advantageously, the holding arrangement comprises a hold capacitor, which provides a hold capacitance as at least a multiple of the sensor capacitance, wherein the latter is formed by the sensor element. The size of the hold capacitance depends, e.g., on the number N of pulses (repetitions of the charge transfers per determination), preferably proportionally to this (e.g. the hold capacitance is at least N multiplied by the sensor capacitance). Since advantageously a fixed and/or low number N of pulses is used, furthermore the advantage can be achieved that the hold capacitance can be selected small, and thus a cost and/or energy saving is enabled.

Charge transfers can be performed, for example, in that repeated electric pulses are initiated and/or transmitted between a holding arrangement and the sensor element by the predetermined number of times. To that end, e.g. the controlling means, such as at least one electric switch element and/or as a part of a microcontroller can be used, which is connected to a transmission path between the holding arrangement and the sensor element and is integrated therein. Furthermore, also a controlling device can be provided in order to determine the predetermined number of repetitions of the charge transfers, in particular pulses so that these are adjusted to a hold capacitance of the holding arrangement and/or to an interfering signal sensitivity of the evaluation and/or to a maximum energy consumption. The controlling device is electrically connected, for example to the at least one controlling means or switch element to that end, in order to activate it in accordance with the settings. For example, the controlling device is formed as a microcontroller or as a part of a microcontroller, which carries out the activation. Just as well, at least a part of a computer program can be understood as the controlling device, as the case may be, or comprise a computer program as an adjustment means, which is formed, for example, by a microcontroller or the control device or the controlling device.

The evaluation principle provided by the arrangement according to the invention can also be understood in such a way that an end-of-charge voltage is detected at the holding arrangement after a known, predetermined and/or fixed number of pulses (i.e. charge transfers). The number and/or duration of the pulses can be specified here, e.g. by a switching of at least one of the (or the only) controlling means for a certain switch time period, in which the charge transfer is enabled. For example, a transmission path can be set-up as a current path between the sensor element and the holding arrangement by the (at least one) adjustment means for the switching period, in order to enable the charge transfer during the switching period, and provide the pulse. In contrast to conventional charge-reversal methods, it is not the number of the pulses that varies, but the end-of-charge voltage dependent upon the parameter. The parameter is preferably a variable sensor capacitance of the sensor element, preferably a sensor electrode. Just as well, the parameter can relate to another electric property of the sensor element and/or the surroundings of the sensor element, which changes upon a change of the surroundings (such as an approach to the vehicle). The name of the parameters also depends on the underlying understanding of the evaluation principle. Anyway, it can be observed that the ability of the sensor element to receive charge carriers and/or the amount of charge transferred in the charge transfers changes upon an influence in the surroundings. In other words, the end-of-charge voltage changes, which can be measured at the holding arrangement (e.g. after a switching duration for the transfer of charge). This parameter can be determined in terms of quantity in order to perform the evaluation and/or detect the activation action.

It is advantageously provided that the at least one controlling means of the control device is configured to perform the charge transfer repeatedly for the respective determination with the predetermined number of times N, so that successively the state of charge of the holding arrangement is changed. The repeatedly performed charge transfers can also each be understood as pulses, since an impulse-like electric charge shift occurs for the respective charge transfer. The repeated performing of the charge transfers, in particular pulses, serves (exactly) one determination, i.e. each individual determination requires multiple charge transfers or pulses of the number N. This provides the advantage that a more interference-sensitive determination of the parameter is possible, compared with an individual charge transfer per determination.

A particular advantage can be achieved if the number N of the pulses, i.e. the number N of the pulses in a pulse sequence and/or the number N of the charge transfer pulses, is selected to be small for each determination. It is in particular understood here that the number N is smaller than 1000, or smaller than 200, or smaller than 100. This provides the advantage that the holding arrangement may comprise a hold capacitor, which can comprise only a comparably low hold capacitance. Thus, costs of the components, and possibly also the current consumption, can be reduced.

It can be provided that the state of charge of the holding arrangement concerns the charge amount stored by the hold capacitance, and/or is proportional to an electric voltage across the holding arrangement (in particular across at least one hold capacitor). To determine (measure) the charge state, a voltage (end-of-charge voltage) can be measured at the holding arrangement for each determination, e.g. by means of an analog-to-digital converter of the control device.

Furthermore, it can be provided that the number and/or a pulse duration of the repeated pulses and/or a time gap between the determinations for adjustment to a interfering signal sensitivity and/or to a maximum energy consumption of the evaluation is provided, preferably in order to reduce the interfering signal sensitivity for the predetermined interfering frequencies and/or in order to reduce the energy consumption. To that end, the number of pulses can be reduced, for example, and/or the frequency spectrum can be adjusted by the adjustment of the pulses. The use of a smaller number of pulses is made possible by the measuring principle according to the invention, for example. Thus, an improved solution for evaluation can be provided as a result.

Furthermore, it is provided in the scope of the invention that the number of the repeated pulses is at most 500, or at most 200, or at most 100, or preferably in a range from 5 to 500, preferably 10 to 350, particularly preferably 20 to 100. In this case, the pulses repeated by the number of N together can form a pulse sequence for the respective determination of the parameter. Furthermore, the charge transfer can be effected for each of the pulses, so that a successive charge accumulation or charge reduction is caused in the holding arrangement e.g. between the first and last pulse of the pulse sequence. Depending on the connection and/or direction of the charge transfer (the current direction), an accumulation or reduction can occur. Just as well, a combination can be used, so that both pulses for charge accumulation and pulses for charge reduction are used for a determination. Thus, the reliability of the evaluation can be further increased.

Furthermore, it can be enabled by the small number of pulses that the frequency sensitivity is changed in a particularly advantageous manner. In particular, a $3^{rd}$ harmonic is no longer in the (problematic) RF range (i.e. radio frequency range). Thus, an at least partially reduced emission is effected within this range and/or there is a lower interfering signal sensitivity for immissions within this range.

In accordance with another option, it can be provided that the number of repeated pulses for the adjustment to a hold capacitance of the holding arrangement is predefined, wherein preferably the hold capacitance is larger than a sensor capacitance provided by the sensor element. As a result, the state of charge can approach a completely charged or discharged state of charge for each of the pulses. In the same way, the hold capacitance can also be adapted to the number of pulses. In this case, a dimensioning can be effected in such a way that a preferably low number of repetitions is performed, in order to reduce the energy consumption.

It is advantageous if the hold capacitance corresponds at least or exactly to N-times a maximally-used sensor capacitance, wherein N is the number of the repeated pulses for the respective determination. Preferably, the maximally used sensor capacitance is the capacitance maximally provided by the sensor element determined in the evaluation as the parameter. It can also be possible that the maximally used sensor capacitance is smaller than the provided capacitance (not the entire sensor capacitance must necessarily be used, this depends on the configuration of the circuit). This allows for a reliable evaluation.

It can further be provided in the scope of the invention that the parameter is a variable sensor capacitance, which is provided by the sensor element. Preferably, a processing unit is provided, in order to determine the sensor capacitance based upon the state of charge, in particular based upon a voltage at the holding arrangement after each predetermined number of repeated charge transfers, i.e. after each pulse sequence. The sensor element can correspondingly be formed as a sensor electrode, which forms a type of capacitor together with a ground potential of the vehicle, for example. For example, in this aspect of the measuring principle, the surroundings of the sensor electrode can have an influence on the capacitance of the capacitor, and thus cause the variable sensor capacitance. The processing unit comprises e.g. a microcontroller and/or an analog-to-digital converter and/or the like. For example, an analog voltage value can be measured across at least one hold capacitor of the holding arrangement by the analog-to-digital converter, and be converted to a digital information, which is evaluated by the processing unit. As a result of the evaluation, e.g. an information about the sensor capacitance can be provided.

Furthermore, it can be possible that a variable sensor capacitance is provided by the sensor element, which is the parameter to be determined. Preferably, for the respective determination of the sensor capacitance, the N pulses form a pulse sequence for charge transfer, in order to receive a quantitative result about the sensor capacitance after each pulse sequence based upon the state of charge.

Furthermore, it can be advantageous in the scope of the invention that a processing unit is provided, preferably an analog-to-digital converter, in order to determine the state of charge in that an electric voltage is measured, which depends upon or corresponds to the electric voltage at the holding arrangement, preferably of a hold capacitor. This provides a reliable option to perform the evaluation.

It can be possible that the control device comprises at least one electronic component, and, as the case may be, is formed as a system made of multiple electronic components. Such an electronic component is, for example, the processing unit and/or the holding arrangement and/or a controlling device. It is also conceivable that these electronic components are at least partially present as an integrated circuit, and that e.g. the controlling device and the processing unit are integrated in a common integrated circuit and/or microcontroller or the like. Thus, it can be reasonable for financial reasons to use the processing unit (e.g. an analog-to-digital converter) as a part of a microcontroller. It may also be reasonable to use the holding arrangement with the hold capacitor as an external component, in order to be able to provide a higher hold capacitance, for example.

It can further be provided that at least one shield element, such as shield electrode, is provided. The shield element can be arranged in the vicinity of the sensor element, in order to influence the detection by the sensor element. For this purpose, the shield element can be connected to a fixed electronic potential, such as a ground potential or a fixed potential different therefrom, e.g. an operating voltage source. Preferably, the shield element is connected to the same potential as the sensor element (e.g. for charging the sensor element, or always). This achieves the advantage that no interfering influence occurs due to the shield capacitance formed between the shield element and the sensor element, which may lead to a better detection. However, during a charge transfer, the potential of the shield element can be changed in order to transfer the charge of the sensor element to a holding arrangement, for example. For this purpose, the potential of the shield element is connected to the ground potential, for example. The shield element is advantageously geometrically formed in such a way that a desired (electric) monitoring field is created in the surroundings of the sensor element. The monitoring field is created or provided by the sensor element, for example. For example, the shield element can limit the monitoring field, so that the detection of the activation action only occurs in a region not shielded by the shield element. In this way, it can be effected by means of the shield element that e.g. the activation action is detected only from a certain direction of the sensor element.

Furthermore, it can optionally be provided that a potential change is performed at the sensor element for performing a charge transfer from the sensor element to the control device, e.g. to a holding arrangement. To that end, the sensor element can be switched from a fixed potential (different from a ground potential) to a ground potential, for example. Alternatively or additionally, the shield element can be switched from this fixed potential to the ground potential for the charge transfer. By the shield element (in particular by the described potential change e.g. to the ground potential), also the potential change in the sensor element can be caused. It is likewise conceivable that the sensor element is always connected to the fixed potential, e.g. the potential of an operating voltage source, and only the electric potential in the shield element is actively changed to initiate the charge transfer from the sensor element thereby. The shield element is arranged in the detection region of the sensor element in such a way, for example, that is has an influence on the electric field of the sensor element and/or on the potential.

Preferably, the shield element, preferably as a shield electrode, can cause a change of the monitoring field of the sensor element in that it is spatially arranged adjacent to the monitoring field of the sensor element. The monitoring field is e.g. the electric field, which is caused by charging of the sensor element and/or severs for the detection of the activation action. The change of the surroundings, such as the activation action, can only be detected in the monitoring field. However, without a shield element, field lines of the monitoring field would be directed to the lowest potential in the surroundings (e.g. toward the vehicle door or tailgate or vehicle body of the vehicle). In order to prevent this, the shield element can be used and in particular have the same electric potential as the sensor element. The field of the shield element thus serves as an obstacle for the monitoring field. The shield element can be connected e.g. invariably to a fixed potential (e.g. always on a potential of the operating voltage source, or on a ground potential). It is also possible that the potential of the shield element is actively switched, e.g. to the same potential as that of the sensor element. Advantageously, the switching occurs every time the potential of the sensor element is switched. This is the case, for example, in a change from a charging of the sensor element to a charge transfer from the sensor element to the control device (and/or vice versa).

It can furthermore be provided that an controlling device is (electrically) interconnected and/or connected with the at least one controlling means for performing switching processes, e.g. a switching of the controlling means between a closed and an open state, in such a way that the determination of the parameter is performed alternately as a first and second determination. For example, the controlling means can be formed as an electronic switch, which is activated by the controlling device such as a processing device and/or a microcontroller and/or the like. The controlling device can thus check (i.e. e.g. control) the switching processes and/or the determination, and can thus also be part of the control device and/or be identical to the control device.

In the scope of this invention, "electrically connected" or also "electrically interconnected" means that the electric connection or switched together can at least partially be present, e.g. even also only in a closed state of a switch element such as an electronic switch. It is also conceivable here that the electric connection or interconnection does not occur exclusively electrically, but e.g. also further means for the signal transmission are used (e.g. an optical signal transmission).

It is possible that the N charge transfers have a first transfer direction, preferably current direction, for the first determination, and subsequently for the second determination the N charge transfers or the charge transfers performed with a further predetermined number have a second transfer direction (preferably current direction), in order to transfer charges from the holding arrangement to the sensor element and in particular in the first transfer direction, and to transfer charges from the sensor element to the holding arrangement in the second transfer direction (or vice versa). The switching between the first and second determination and/or performing of the respective determination can be controlled, as the case may be, by the controlling device, e.g. by a corresponding switching of at least one controlling means. In particular, multiple controlling means can be brought into different switching states, in order to thereby dynamically change current paths and thus control the current direction. The use of different current directions for the charge transfer in at least two successive determinations comes with the advantage that failures and/or error sources are reduced, and/or the evaluation can be performed quicker and/or more reliable.

It is also optionally conceivable that the at least one controlling means can be activated in accordance with such a sequence by an controlling device that a transfer direction (in particular electric current direction) of the charge transfers in the in particular successive determinations, is different, in order to combine the determinations and thus obtain an determination result reduced in interference about the parameter. The combination can, for example, occur after performing the two or more successive determinations in that the respectively determined parameters (both of them) are evaluated and/or compared and/or added for a (single) evaluation.

In the arrangement according to the invention, it is conceivable that multiple determinations (i.e. respective determination results, such as a determined value of the parameter) are combined, e.g. added up and/or subtracted and/or averaged. In this way, interferences and/or noise can be reduced.

It is also conceivable that a hold capacitor of the holding arrangement is charged multiple times with the charge stored in the sensor element by the pulses for one single determination, in order to achieve a reduction in interference and/or an averaging. Thus, it is provided, as the case may be, that the electric capacitance of the hold capacitor (the hold capacitance) is at least a multiple of the electric capacitance of the sensor device (of the sensor capacitance, i.e. the capacitance formed by the sensor element). Thus, the capacitor can also be a hold capacitor which is formed externally by a microcontroller used for the controlling device and/or for the processing unit. In other words, the use of the repeated pulses can reduce interference and/or noise, since the charges are summed-up. The end-of-charge voltage can be measured only after performing the repeated pulses for the charge transfer.

Another subject-matter of the invention is a method for an evaluation in a capacitive sensor device of a vehicle, in particular for the detection of an activation action at the vehicle. It is provided here that an arrangement, in particular an arrangement according to the invention, with a sensor element and a holding arrangement can be used here.

Advantageously, in the method according to the invention, at least one of the following steps can be performed, wherein the steps are preferably performed one after the other in the specified order or in any order, and, as the case may be, individual steps can be repeated:
a) performing at least a first determination of a (preferably electric) parameter of the sensor element, such as a variable (sensor) capacitance,
b) performing at least a second determination of the parameter (of the sensor element),
wherein for the respective evaluation preferably a charge transfer between the sensor element and the holding arrangement is repeatedly performed as pulses in particular by a predetermined number of times for the respective determination of the parameter, so that preferably successively a state of charge of the holding arrangement is changed in order to determine the parameter based upon the state of charge (e.g. after the repeated charge transfer). Thus, the method according to the invention provides the same advantages as have been explained in detail with reference to an arrangement according to the invention.

In particular, the first determination differs from the second determination by the transfer direction (current direction) of the respective charge transfers. Preferably, the first determination and the second determination are performed chronologically one after the other.

For example, it can be provided that (only) after each of the determinations, the state of charge is detected by means of an end-of-charge voltage, which depends on or corresponds to an electric voltage of the holding arrangement, and which is applied on the holding arrangement in particular after each pulse sequence of pulses of the predetermined number. In other words, the state of charge can be determined on the holding arrangement for each determination after the repeated charge transfer, in order to use this state in a particularly reliable manner for the determination of the parameter. Each determination can be caused by the repeated charge transfer, since the charge transfers depend on the parameter, such as the variable capacitance.

Optionally, it can be provided that the sensor element is connected to a fixed potential, preferably ground potential, for the detection of the state of charge, preferably by measuring an end-of-charge voltage, and preferably is connected to a fixed potential for the first determination, that differs from that for the second determination.

Likewise, it is also possible, for example, that a charge transfer is effected from the holding arrangement, e.g. from a hold capacitor to the sensor element, and in the second determination, the charge transfer is effected in the other direction. Subsequently, further first and second determinations can be performed in the same order, in order to thereby reduce failures and errors, for example.

According to another advantage, it can be provided that the charge transfer is effected in the first determination from the holding arrangement to the sensor element, and/or both the holding arrangement and the sensor element are charged, and in the second determination the charge transfer is effected from the sensor element to the holding arrangement. Accordingly, in subsequent determinations, different current directions can be used for the charge transfer, in order to reduce errors and failures in the detection.

It is optionally conceivable that the first determination and the second determination are combined, preferably at least subtracted, in order to determine the parameter in such a way that a common mode rejection is effected. For example, for the first determination, the sensor element can be connected to a fixed ground potential, and the sensor element can be connected to a potential of an operating voltage source for the second determination. In other words, a discharging of the sensor element can be used for the first determination (sample A), and a charging of the sensor element can be used for the second determination (sample B), wherein in particular the charge shift caused thereby is used in order to change a state of charge in the holding arrangement successively. Sample A and sample B, i.e. for example the respective state of charges detected in the determinations, can be subtracted there, as the case may be, in order to cause the common mode rejection. In other words, the combination can be effected in that a first result of a first determination and a second result of a second determination are combined, in order to hereby obtain one single overall result, with an improved informative value than the respective individual results.

In a further option, it can be provided that the first determination and at least one further (temporally successive) first determination are combined, and/or the second determination and at least one further (temporally successive) second determination are combined, preferably at least added up, in order to determine the parameter in such a way that a series mode rejection is effected. Thus, besides the first and second determination, further first and second determinations can follow, wherein, e.g. similar determinations (with the same current direction in the charge transfer) can be used to cause the push/pull suppression. In other words, a sample A can be combined with a further sample A, and a sample B can be combined with a further sample B.

Furthermore, it is conceivable that the number N of pulses is fixedly defined by a controlling device and/or cannot be changed for each determination. In contrast to conventional methods, the number N of pulses is not the measuring parameter, but instead an end-of-charge voltage can be used as the measuring parameter.

Furthermore, it is conceivable in the scope of the invention that a controlling device is configured to vary a pulse duration of the pulses in particular for different pulse sequences and/or different determinations (in particular modulate them), in order to perform a frequency variation (in particular a frequency sensitivity) in the evaluation. For example, different frequencies can be used for different determinations as well. In this way, a desired frequency spectrum can be achieved, in order to prevent e.g. interfering frequencies and/or a high sensitivity in the radio frequency range.

It can likewise be possible that a shield element is activated dependent upon the charge transfer and/or a charging of the sensor element, preferably during the charging, or is always connected to the same potential as the sensor element, to define a monitoring range of the sensor device. Alternatively or additionally, in the charge transfer, the shield element can be actively connected to a fixed potential such as a ground potential and/or the potential of the sensor element. In this way, interfering factors can be further reduced and/or the monitoring range can be determined in a targeted manner, in which the change in the surroundings or the activation action can be detected by the sensor element.

The invention also covers a system comprising the arrangement according to the invention. In this case, a vehicle having the arrangement according to the invention is a part of the system, if applicable.

BRIEF DESCRIPTION OF THE SEVERAL VIEWS OF THE DRAWINGS

Further advantages, features and details of the invention result from the following description, in which exemplary embodiments of the invention are described in detail with reference to the drawings. Here, the features mentioned in the claims and in the description can each per se, or on any combination, be essential to the invention. The Figures show in:

Identical reference characters are used in the following figures for the same technical features even of different exemplary embodiments.

DESCRIPTION OF SPECIFIC EMBODIMENTS OF THE INVENTION

Figure 1:
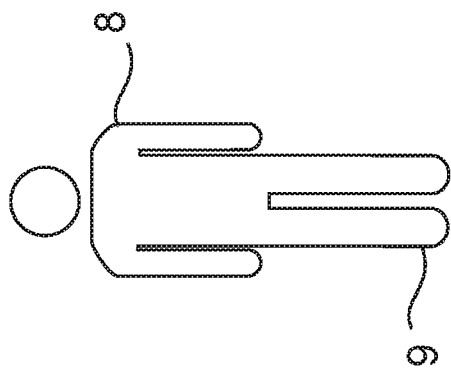
FIG. 1 a schematic representation of parts of an arrangement according to the invention, FIG. 2 a schematic circuit plan of an arrangement according to the invention, FIG. 3 a schematic visualization of a method according to the invention, FIG. 4 a further schematic visualization of a method according to the invention, FIG. 5 a schematic circuit plan of an arrangement according to the invention.
Figure 1:
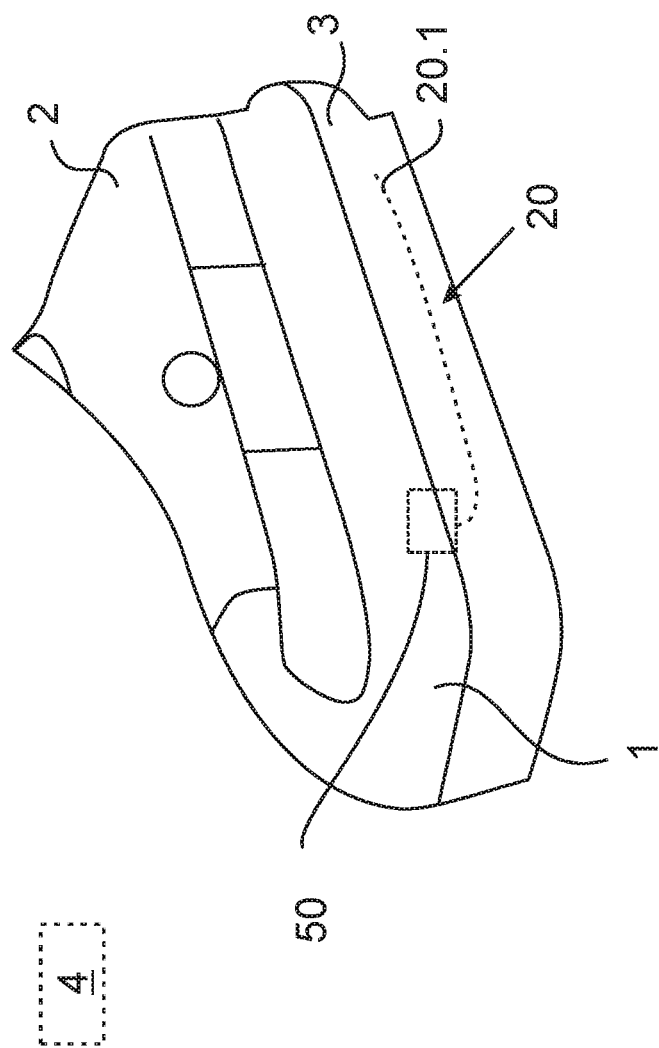

FIG. 1 schematically shows parts of an arrangement 10 according to the invention, which, by way of example, is arranged in the rear area of a vehicle 1. It is discernable that at least one sensor element 20.1 of a capacitive sensor device 20 of an arrangement 10 according to the invention can be arranged in a bumper 3 of the vehicle 1. The sensor element 20.1 can be formed e.g. as a sensor electrode and/or as an electric conductor, such as an electric cable. Further, a control device 50 on the vehicle 1 can be used to perform a method according to the invention.

The sensor element 20.1 is for example formed as an elongated electric conductor, which extends in the transversal direction of the vehicle inside the bumper 3. Alternatively or additionally, an arrangement of the sensor element 20.1, which is not shown, is conceivable in the side or front region of the vehicle 1, e.g. in a door handle 4 or the like. In the case shown, the sensor element 20.1 can be used to detect an activation action of a user 8. To that end, the user 8 moves e.g. a part of the body 9 as an activation means 9 to below the bumper 3. The detection of this activation action can lead to an activation of a vehicle function then, such as an opening of a tailgate 2.

Figure 2:
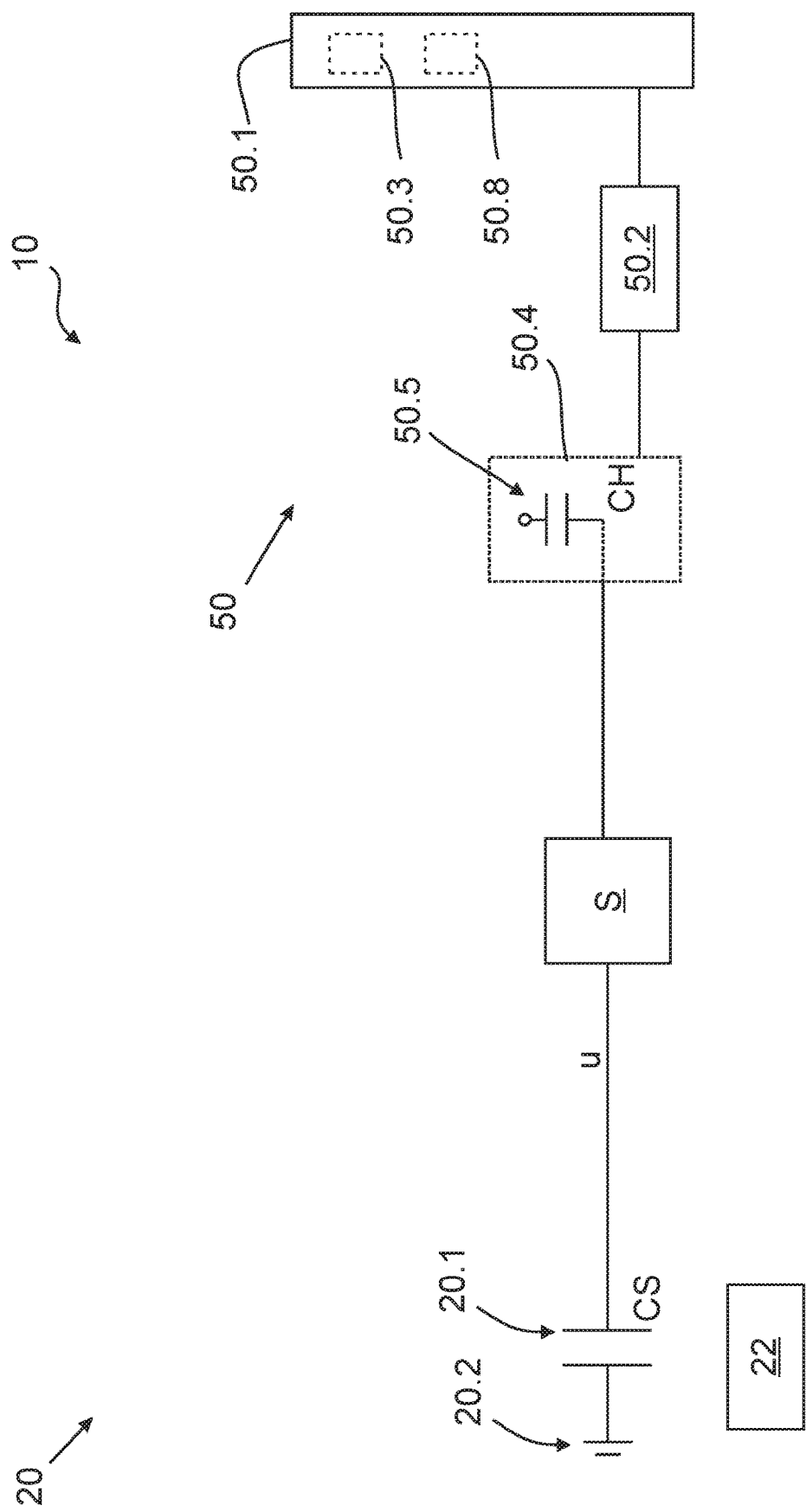
Figure 4:
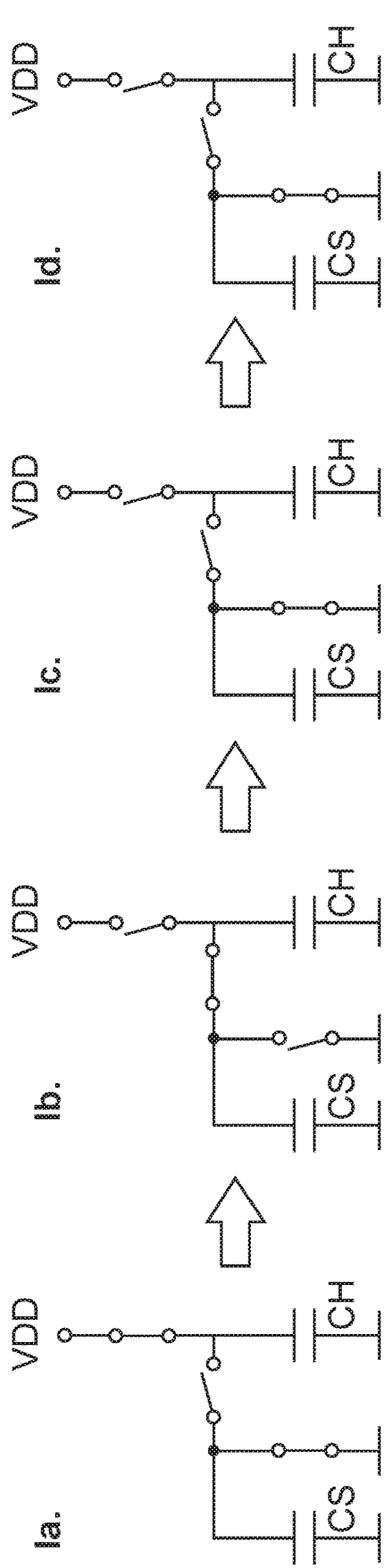
Figure 4:
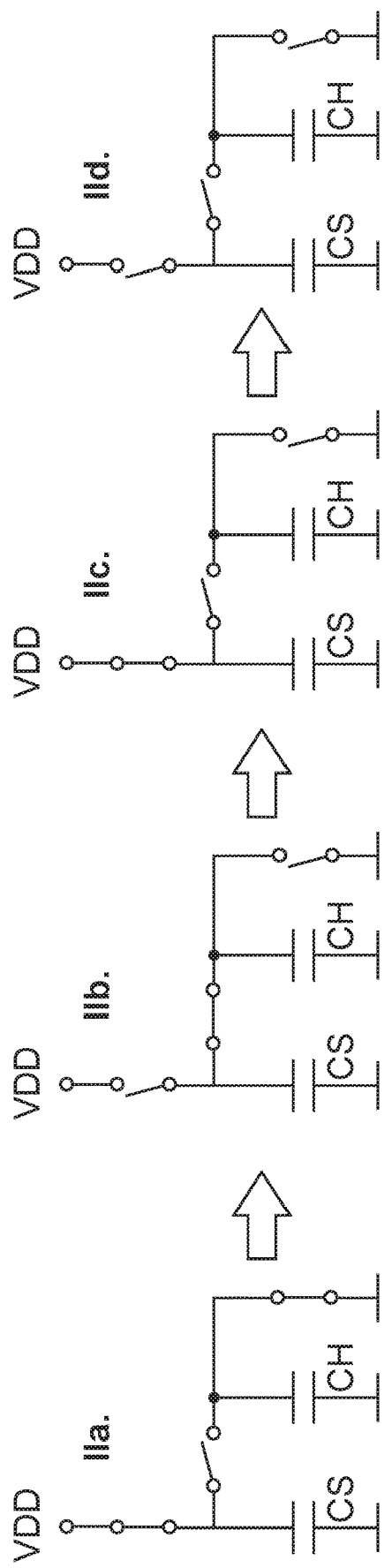
Figure 5:
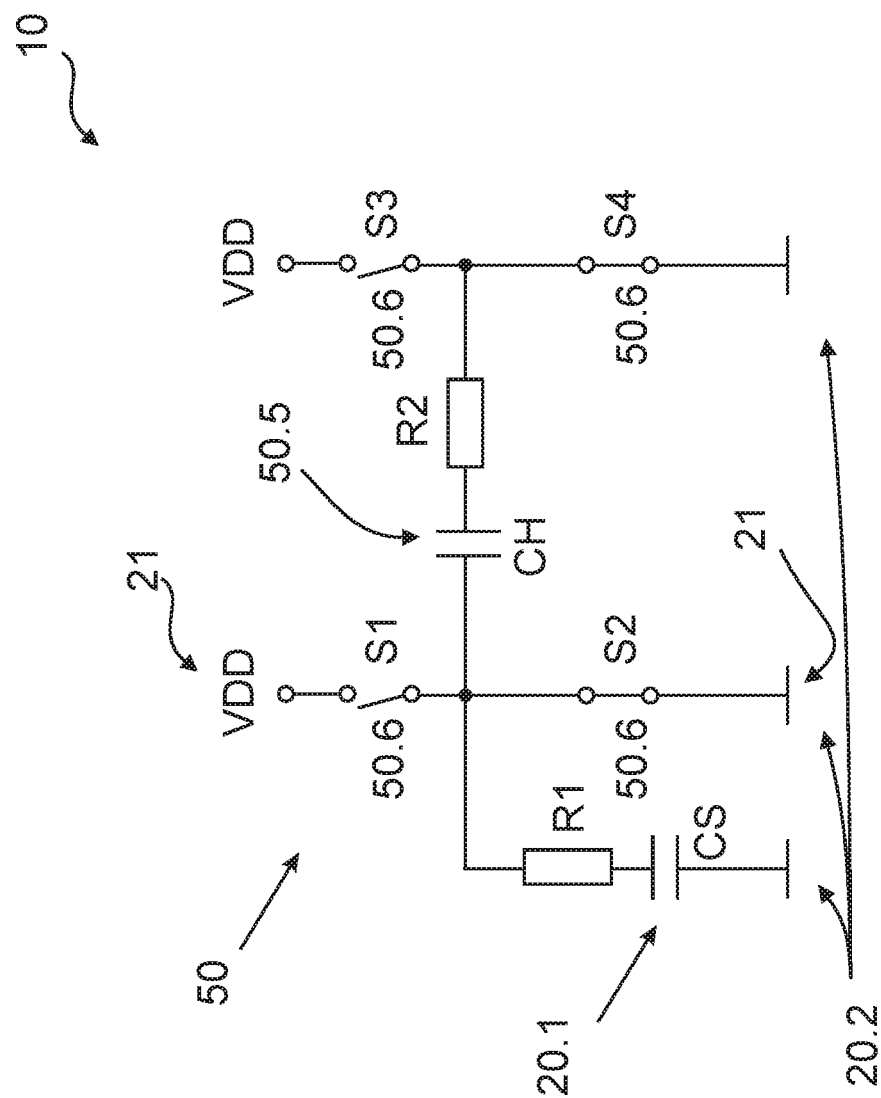

In order to enable the detection with higher reliability, and in particular in order to reduce interfering factors and/or the energy consumption, the arrangement 10 according to the invention can be constructed in accordance with FIGS. 2, 4 and 5. The arrangement 10 serves for the evaluation in the sensor device 20 of the vehicle 1, in particular for the detection of the activation action at the vehicle 1, and, as appropriate, uses the following electronic components to that end:

at least one sensor element 20.1 for the detection of a change in a surroundings of the sensor element 20.1, where the activation action takes place, an electric holding arrangement 50.4, which is interconnected and/or connected to the sensor element 20.1 for the transfer of charge, a control device 50 for the repeated determination of at least one parameter of the sensor element 20.1 specific to the detection, in order to perform the evaluation, wherein the holding arrangement 50.4 can be a part of the control device 50, and can be arranged e.g. on the same circuit board (not shown), at least one activation means 50.6, in particular a switch element S, of the control device 50, in order to perform the charge transfer repeatedly as a pulse P with the predetermined number N for the respective determination of the parameter, so that a state of charge of the holding device 50.4 is changed successively.

The detection principle for the evaluation of the sensor device 20 or for the detection of the activation action can be understood in such a way that the sensor element 20.1, in particular as a sensor electrode 20.1, is formed a sensor capacitance CS toward a ground potential 20.2. Thus, a charging of the sensor device 20 (i.e. a charge transfer toward the sensor element 20.1) and a discharging of the sensor device 20 (i.e. a charge transfer from the sensor element 20.1 e.g. toward the holding device 50.4) can be effected via a transmission path u. In order to control these processes, e.g. at least one switch element S can be used as a controlling means 50.6. The switch element S, which is schematically shown as a block in FIG. 2, can represent an interconnection of multiple switching elements S for illustration purposes. For example, the switching element S or the controlling means 50.6 is activated by an adjustment means 50.3, e.g. a software of the controlling device 50.1. The discharge can result in that the holding arrangement 50.4 is charged by the hold capacitor 50.5 (and the hold capacitance CH assigned to it). In the case that the hold capacitor 50.5 is switched to be floating during the charging of the sensor device 20, the charge can be kept in the hold capacitor 50.5, until the next transfer of charge is effected from the sensor element 20.1 towards the hold capacitor 50.5 for the further charging of the hold capacitor 50.5. In this way, an accumulation of the charge (and thus a successive change of the state of charge of the holding arrangement 50.4) can be performed. After discharging the sensor device 20 (or charging the hold capacitor 50.5) multiple times the state of charge was changed for each discharge successively, and the state of charge (such as e.g. an end-of-charge voltage) can be detected via a processing unit 50.2, e.g. a microcontroller and/or an analog to digital converter. By an evaluation by means of a controlling device 50.1, in particular processing device 50.1, such as a microcontroller, the parameter can be determined, and the presence of the activation action can be concluded from the detection of a significant change of the parameter. The parameter is the variable sensor capacitance CS, for example. The processing unit 50.2 can e.g. also be part of the processing device 50.1.

Furthermore, it is shown in FIG. 2 that at least one shield element 22, such as a shield electrode 22, can be provided. The shield element 22 can be arranged in the vicinity of the sensor element 20.1, in order to have an influence on the detection. To that end, the shield element 22 can be connected to a fixed electric potential, e.g. such as a ground potential 20.2 or a fixed potential 21 different from that e.g., such as an operating voltage source. Preferably, the shield element 22 is connected to the same potential as the sensor element 20.1. However, during a charge transfer, the potential of the shield element 22 can be changed, as required.

Figure 3:
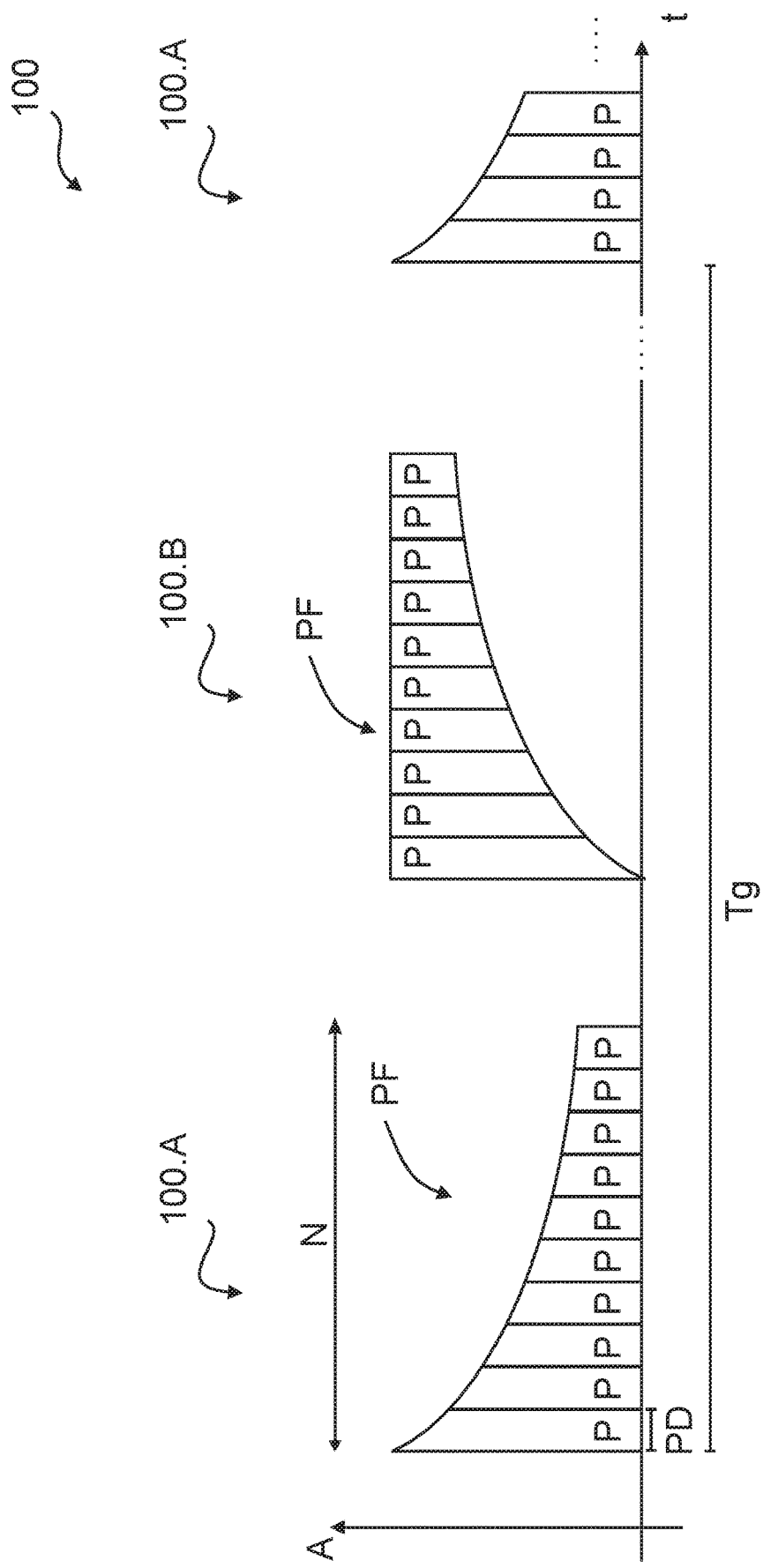

In order to enable a controlling of these processes in accordance with a method according to the invention, as is visualized in FIG. 3 by way of example, the course of the processes can be predetermined by means of an adjustment means 50.3. This is a software, for example, which is stored in the controlling device 50.1, e.g. in a data store 50.8, in a non-volatile manner. It can be discerned in FIG. 3 that first a pulse sequence PF of pulses P with, if necessary, a variable amplitude A and a pulse duration PD (over time t) leads to a charging and/or discharging of the sensor element 20.1. Preferably, in a first determination 100.A, a charge transfer takes place from the holding arrangement 50.4 to the sensor element 20.1. Likewise, it can be possible in the first determination 100.A, depending on the circuit configuration, that both the holding arrangement 50.4 and the sensor element 20.1 are being charged. The state of charge of the holding arrangement 50.4 can change with each charging (e.g. increase or decrease) and the voltage A across the hold capacitor 50.5 can increase or decrease (depending on the circuit configuration). The successive decrease of the voltage A in the first determination 100.A is shown by way of example here. The last voltage value is the end-of-charge voltage, which may serve as an indicator for the change of the sensor capacitance CS. In a second determination 100.B, another type of charge transfer can occur, and, for example, the charge transfer can occur from the sensor element 20.1 to the holding arrangement 50.4. In this case, a successive increase of the state of charge of the holding arrangement 50.4 or of the hold capacitor 50.5 results. The first and second determination 100.A and 100.B can—as shown in FIG. 3—be repeated in this order, wherein there is a gap Tg between the first determination 100.A and the temporally next first determination 100.A.

FIG. 4 shows the principle for performing determinations by way of example, wherein only the capacitances CH and CS are shows for a simpler illustration, as well as schematic switch positions of switching elements. Since these are theoretical circuit plans, the actual structure can be different. According to the method steps Ia to Id, the first determination 100.A occurs with a successively performed charge transfer from the holding arrangement 50.4 to the sensor element 20.1. According to the method steps IIa to IId, the transfer direction is reversed, that is, from the sensor element 20.1 to the holding arrangement 50.4.

First, in accordance with Ia, a charging of the hold capacitor 50.5 of the holding arrangement 50.4 with the hold capacitance CH is effected by an energy supply VDD (e.g. as a potential of an operating voltage source). Subsequently, in accordance with Ib, a charge transfer from the hold capacitor 50.5 to the sensor element 20.1 occurs, which provides a sensor capacitance CS. Since the sensor capacitance CS is smaller than the hold capacitance CH, it is possible that a complete discharge of the hold capacitor 50.5 may not occur. Next, in accordance with Ic, the sensor element 20.1 is discharged, by connecting it to a fixed ground potential 20.2 (by switching a corresponding switch element). The steps Ib and Ic are repeated then for N number of times, so that the charge transfer is conducted repeatedly with a predetermined number N, in order to successively change a state of charge of the holding arrangement 50.4. Since the hold capacitance CH is at least the multiple of the sensor capacitance CS, e.g. multiple repetitions cause a successive discharge of the hold capacitor 50.5. In other words, the voltage A across the hold capacitor 50.5 is successively lowered for each repetition in each pulse (see first determination 100.A in FIG. 3). Subsequently, in accordance with step Id, a measuring of the voltage occurs (end-of-charge-voltage) across the hold capacitor 50.5, in order to obtain a value for the parameter (in particular the sensor capacitance CS). The voltage value measured here corresponds to the determination result of the first determination 100.A, i.e. a first value of the parameter (sample A).

In accordance with steps IIa to IId, the reversed charge transfer from the sensor element 20.1 to the hold capacitor 50.5 is effected. To that, first, in accordance with IIa, the sensor element 20.1 is charged, e.g. by the energy supply VDD. In accordance with IIb, a charge transfer from the sensor element 20.1 (reference character CS) to the hold capacitor 50.5 (reference character CH) is effected, since a corresponding switch element closes a current path between these elements 20.1, 50.5. In accordance with step 11c, the hold capacitor 50.5 is placed to be floating, so that it will not lose the stored charge. Then, the sensor element 20.1 is charged again. Steps IIb to IIc are repeated N times, in order to successively increase the state of charge of the hold capacitor 50.5 and thus the voltage A across the hold capacitor 50.5 (see second determination 100.B in FIG. 3). Subsequently, in accordance with IId, the end-of-charge voltage, that is, the voltage across the hold capacitor 50.5 after completion of the repeated charge transfers for a respective determination, is measured. The value measured here corresponds to the determination result of the second determination 100.B, i.e. a second value of the parameter (sample B).

In order to improve the determination of the parameter, the values sample A and sample B can be combined with each other, e.g. be arithmetically added and/or subtracted by a processing device 50.1 The determinations 100.A, 100.B can be repeated every 8 ms, for example, to perform the detection of the activation action. The switch frequencies for performing the pulses can be adjusted to potential interfering frequencies. Just as well, signal filters and/or a signal processing can be used to further improve detection.

FIG. 5 shows a further schematic circuit diagram of a circuit, which is suitable to perform the first and second determination 100.A, 100.B. Besides an exemplary operating voltage VDD, resistors R1, R2 are shown here. In the shown initial state, a first and a third switch element S1, S3 are opened, and a second and fourth switch element S2, S4 are closed.

For performing the first determination 100.A, first the first switch element S1 and the third switch element S3 are opened, but a second and fourth switch element S2, S4 are closed. In this way, both the sensor element 20.1 and the hold capacitor 50.5 are discharged. After that, S1, S2 and S4 can be opened, and S3 can be closed, in order to charge the sensor element 20.1 (i.e. the sensor capacitance CS formed thereby) as well as the hold capacitor 50.5 (charging phase). Subsequently, S1, S3 and S4 can be opened, and S2 can be closed, in order to place the hold capacitor 50.5 at least at one port to be floating and to maintain the state of charge, as well as in order to discharge the sensor element 20.1 (discharging phase). The state of charge of the hold capacitor 50.5 can successively be changed (increased) and/or the voltage across the sensor capacitance CS can be lowered by repeating the charging and discharging phases N times. The voltage value measured after the repetitions N (e.g. of an end-of-charge-voltage measured across the hold capacitor 50.5) corresponds to sample A, and can, for example, be determined via a processing unit 50.2.

For the determination of the sample B, i.e. for performing the second determination 100.B, first a first switch element S1 and third switch element S3 can be closed, a second and fourth switch element S2, S4 can be opened, in order to perform the discharging of the hold capacitor 50.5 and the charging of the sensor element 20.1. Then, a charge transfer from the sensor element 20.1 to the hold capacitor 50.5 can take place, in that all switch elements S1, S2, and S3, except S4, are opened. After that, the sensor element 20.1 can be charged again, wherein S1 is closed and S2 to S4 are opened, in order to maintain the state of charge of the hold capacitor 50.5. The last two steps (the charge transfer and the subsequent charging of the sensor element 20.1) are repeated N times, in order to subsequently determine sample B by the measuring of the end-of-charge voltage.

The above description of the exemplary embodiments describes the present invention merely by way of examples. Individual features of the embodiments can naturally be combined with one another, as far as technically reasonable, without departing from the scope of the present invention.

LIST OF REFERENCE CHARACTERS

1 Vehicle
2 Tailgate
3 Bumper
4 Door handle
8 User
9 Body part, activation means
10 Arrangement, circuit arrangement
20 Sensor device
20.1 Sensor element, sensor electrode
20.2 Ground potential
21 Fixed potential
22 Shield element, shield electrode
50 Control device
50.1 Controlling device, processing device, microcontroller
50.2 Processing unit, microcontroller, analog-to-digital converter (AD converter)
50.3 Adjustment means, software
50.4 Holding arrangement
50.5 Hold capacitor
50.6 Controlling means
50.8 Data store
100 Determination
100.A first determination
100.B second determination
t Time
u Transmission path
A Amplitude, measured voltage
CH Hold capacitance
CS Sensor capacitance
N Number
P Pulse
PD Pulse duration
PF Pulse sequence
Rn $n^{th}$ resistor element
S Switching element
Sn $n^{th}$ switching element
Tg Gap between measurements (determinations)

What is claimed is:

1. An arrangement for an evaluation in a capacitive sensor device of a vehicle, comprising:
at least one sensor element for the detection of a change in a surroundings of the sensor element,
an electric holding arrangement which is connected to the sensor element for the transfer of charge,
a control device for the repeated determination of at least one parameter of the at least one sensor element specific to the detection, in order to perform the evaluation,
wherein the control device is adapted to perform, for the respective determination of the parameter, the transfer of charge repeatedly as pulses with a predetermined number, so that a state of charge of the holding arrangement is changed successively, wherein at least the number or a pulse duration at least of the repeated pulses or a time gap between the determinations is predetermined for adjustment to an interference signal sensitivity of the evaluation, in order to reduce the interference signal sensitivity for predetermined interfering frequencies.

2. The arrangement according to claim 1, wherein the number of the repeated pulses is selected from a group consisting of:
at most 500,
at most 200,
at most 100,
in the range from 5 to 500,
in the range from 10 to 350,
wherein the pulses, repeated by the number, together form a pulse sequence for the respective determination of the parameter, and the charge transfer is effected for each of these pulses, so that a successive charge accumulation or reduction occurs in the holding arrangement between the first and the last pulse of the pulse sequence.

3. An arrangement for an evaluation in a capacitive sensor device of a vehicle, comprising:
   at least one sensor element for the detection of a change in a surroundings of the sensor element,
   an electric holding arrangement which is connected to the sensor element for the transfer of charge,
   a control device for the repeated determination of at least one parameter of the at least one sensor element specific to the detection, in order to perform the evaluation,
   wherein the control device is adapted to perform, for the respective determination of the parameter, the transfer of charge repeatedly as pulses with a predetermined number, so that a state of charge of the holding arrangement is changed successively;
   wherein the number of the repeated pulses is predetermined for adjustment to a hold capacitance of the holding arrangement, wherein the hold capacitance is greater than a sensor capacitance provided by the sensor element, so that the state of charge successively approaches a completely charged or discharged state of charge for each pulse.

4. The arrangement according to claim 1, wherein the hold capacitance corresponds at least or exactly to N-times a maximally-used sensor capacitance, wherein N is the number of the repeated pulses for the respective determination, wherein the maximally-used sensor capacitance is the capacitance maximally provided by the sensor element, which is determined as the parameter in the evaluation.

5. The arrangement according to claim 1, wherein the parameter is a variable sensor capacitance, which is provided by the sensor element, wherein the arrangement further comprises a processing unit adapted to determine the sensor capacitance after each predetermined number of the repeated charge transfers.

6. The arrangement according to claim 1, further comprising a processing unit is adapted to determine the state of charge in that an electric voltage is measured, which depends on or corresponds to the electric voltage at the holding device.

7. The arrangement according to claim 1, wherein the controlling device is adapted for performing transitions in such a way that the determination of the parameter is carried out alternatingly as a first and second determination, wherein
   for the first determination, a plurality of charge transfers have a current direction are instructed,
   subsequently, for the second determination, the plurality of charge transfers or a plurality of further charge transfers performed with a further number have a second transfer direction are instructed in order to transfer charges in the first transfer direction from the holding arrangement to the sensor element, and from the sensor element to the holding arrangement in the second transfer direction.

8. An arrangement for an evaluation in a capacitive sensor device of a vehicle, comprising:
   at least one sensor element for the detection of a change in a surroundings of the sensor element,
   an electric holding arrangement which is connected to the sensor element for the transfer of charge,
   a control device for the repeated determination of at least one parameter of the at least one sensor element specific to the detection, in order to perform the evaluation,
   wherein the control device is adapted to perform, for the respective determination of the parameter, the transfer of charge repeatedly as pulses with a predetermined number, so that a state of charge of the holding arrangement is changed successively,
   wherein the controlling device controls a transfer direction of the charge transfers is different in the determinations, in order to combine the determinations and to thus obtain a determination result reduced in interference about the parameter.

9. A method for an evaluation in a capacitive sensor device of a vehicle using an arrangement comprising a sensor element and a holding arrangement, wherein the following steps are performed:
   a) performing at least one first determination of a parameter of the sensor element,
   b) performing at least one second determination of the parameter,
      wherein, for the respective determination of the parameter, a transfer of charge between the sensor element and the holding arrangement is performed repeatedly as pulses with a predetermined number, so that a state of charge of the holding arrangement is changed successively, in order to determine the parameter based upon the state of charge, wherein an controlling device is configured to vary at least a pulse duration of the pulses, or different determinations, in order to perform a frequency variation in the evaluation.

10. The method according to claim 9, wherein for a detection of the state of charge by a measuring of an end-of-charge voltage, the sensor element is connected to a ground potential for performing the at least one first determination; wherein the sensor is connected to a fixed potential different from that used for the second determination.

11. The method according to claim 9, wherein in the first determination, the charge transfer is effected at least from the holding arrangement to the sensor element or both the holding arrangement and the sensor element are being charged, and the charge transfer is effected from the sensor element to the holding arrangement in the second determination.

12. The method according to claim 9, wherein the first determination and the second determination are at least subtracted in order to determine the parameter in such a way that a common-mode rejection is effected.

13. The method according to claim 9, wherein at least the first determination and at least one further first determination are combined, or the second determination and at least one further second determination are at least added-up in order to determine the parameter in such a way that a series mode rejection is effected.

14. The method according to claim 9, wherein the number of the pulses is at least fixedly predefined by a controlling device or cannot be changed for each determination.

15. The method according to claim 9, wherein after each determination, the state of charge is detected by an end-of-charge voltage, which depends on or corresponds to an electric voltage of the holding arrangement, which is applied on the holding arrangement after each pulse sequence of pulses of the predetermined number.

16. The method according to claim 9, wherein a shield element is activated at least dependent upon the charge transfer or a charging of the sensor element, and is connected to the same potential as the sensor element during the charging process, in order to define a monitoring range of the sensor device.

17. The method according to claim 9, wherein the arrangement is formed for an evaluation in a capacitive sensor device of a vehicle, comprising:
   at least one sensor element for the detection of a change in a surroundings of the sensor element,
   an electric holding arrangement which is connected to the sensor element for the transfer of charge,
   a control device for the repeated determination of at least one parameter of the at least one sensor element specific to the detection, in order to perform the evaluation,
   wherein the control device in performs, for the respective determination of the parameter, the transfer of charge repeatedly as pulses with a predetermined number, so that a state of charge of the holding arrangement is changed successively.

* * * * *